United States Patent [19]

Berman et al.

[11] Patent Number: 5,257,201
[45] Date of Patent: Oct. 26, 1993

[54] METHOD TO EFFICIENTLY REDUCE THE NUMBER OF CONNECTIONS IN A CIRCUIT

[75] Inventors: Charles L. Berman, New York; Louise H. Trevillyan, Katonah, both of N.Y.

[73] Assignee: International Business Machines Corporation, Armonk, N.Y.

[21] Appl. No.: 394,247

[22] Filed: Aug. 14, 1989

Related U.S. Application Data

[63] Continuation of Ser. No. 28,277, Mar. 20, 1987, abandoned.

[51] Int. Cl.$^5$ .............................................. G06F 15/60
[52] U.S. Cl. ...................................... 364/489; 364/488
[58] Field of Search ............... 364/488, 489, 490, 491, 364/200, 900, 578; 395/140, 141

[56] References Cited

U.S. PATENT DOCUMENTS

| T940,013 | 11/1975 | Ho | 364/489 |
|---|---|---|---|
| 3,622,762 | 11/1971 | Dyer et al. | 364/489 |
| 4,306,286 | 12/1981 | Cocke et al. | 364/488 |
| 4,495,559 | 1/1985 | Gelatt, Jr. et al. | 364/491 |
| 4,564,773 | 1/1986 | Tanizawa et al. | 364/491 |
| 4,593,363 | 6/1986 | Burstein et al. | 364/491 |
| 4,636,966 | 1/1987 | Yamada et al. | 364/491 |
| 4,697,241 | 9/1987 | Lavi | 364/488 |
| 4,700,316 | 10/1987 | Nair | 364/488 |
| 4,703,435 | 10/1987 | Darringer et al. | 364/489 |
| 4,916,627 | 4/1990 | Hathway | 364/490 |
| 5,151,867 | 9/1992 | Hooper et al. | 364/489 |

OTHER PUBLICATIONS

William I. Fletcher, "An Engineering Approach to Digital Design", Chapter 3, pp. 167-185, 1980, Prentice-Hall Inc., New Jersey.

Primary Examiner—Vincent N. Trans
Attorney, Agent, or Firm—Jack M. Arnold

[57] ABSTRACT

A provided logic circuitry implementation in a given technology includes n signals and m nodes. A final logic circuitry implementation is produced therefrom which is the functional equivalent of, and contains fewer connections than, the provided logic circuitry implementation. A given one of the n signals is first processed, and global information is computed for this signal. A graphical representation of connections between the m nodes is derived from the computed global information. A list of nodes that form a cut-set is produced from the graphical representation, and an optimized logic circuitry implementation is provided as a function thereof. Each of the remaining ones of the n signals are processed sequentially, as above, to form successive optimized logic circuitry implementations, with the processing of the nth signal resulting in the final logic circuitry implementation.

8 Claims, 14 Drawing Sheets

METHOD TO EFFICIENTLY REDUCE THE NUMBER OF CONNECTIONS IN A CIRCUIT

This is a continuation of application Ser. No. 07/028,277, filed Mar. 20, 1987 now abandoned.

BACKGROUND OF THE INVENTION

This invention is directed to logic design, and more particularly to a method of taking a provided network configuration which may be the result of an automated logic design, and producing therefrom a final network configuration which is the functional equivalent of, and contains fewer connections than, the provided network configuration.

As the complexity of processors has increased, the task of processor logic design has become more difficult. The designer may begin by designing a flow chart or other register-transfer level description to describe the intended operation of the processor, and the processor operation is then simulated from this description in order to ensure that a processor operating in accordance with the flow chart will provide the desired results. A logic implementation is then designed to achieve the operation described in the flow chart, and the resulting logic diagram and original flow chart specification are compared to ensure consistency. Finally, a physical layout is designed in accordance with the logic implementation.

The above process has become significantly more difficult and extraordinarily time consuming with the increasing complexity of the processors being designed. For example, each chip in the 3081 processor available from International Business Machines Corporation includes over 700 circuits capable of performing extremely complex functions.

The flow chart specification of such processor will be quite complex, and even a first attempt at logic diagram implementation will require a substantial amount of time. Further, with increasing processor complexity, the competing interest of gate count and timing constraints become increasingly difficult to satisfy. More particularly, a typical timing constraint may be that a signal must be provided from the output of register A to the input of register B within some predetermined period of time, and the designer may first propose a logic arrangement intended to satisfy this timing constraint while using a minimal number of gates in the circuit path between registers A and B. After timing analysis, however, it may be discovered that the timing constraint has not been satisfied, and the designer must then revise the arrangement of logic between the registers A and B, e.g., by using a larger number of gates to improve the processing speed in that area. Several iterations of design may be required before a logic design is obtained which indeed satisfies all timing constraints with the minimum gate count, and it is therefore not uncommon for the logic design to be quite costly in terms of engineering time.

In view of the above, there has been significant recent activity in the field of automatic logic synthesis. Early work centered on developing algorithms for translating a boolean function into a minimum 2-level network of boolean primitives, and extensions were developed for handling limited circuit fan-in and alternative cost functions. However, because these algorithms employ 2-level minimization, the time required to implement these algorithms increases exponentially with the number of circuits. The use of such algorithms therefore becomes impractical in designing large processors.

Other efforts have attempted to raise the level of specification, e.g., by beginning with behavioral specifications and producing technology-independent implementations at the level of boolean equations. However, the results of such techniques were usually more expensive than manual implementations and did not take advantage of the target technology. For example, the system described by T. D. Friedman et al, in "METHODS USED IN AN AUTOMATIC LOGIC DESIGN GENERATOR (ALERT), " IEEE Trans. Computers C-18, 593–614 (1969), produced implementation for an IBM 1800 processor which required 160% more gates than the manual design for that same processor. Several attempts have been made to produce more efficient logic and to give the designer more control over the implementation, e.g., as described by: H. Schorr, "TOWARD THE AUTOMATIC ANALYSIS AND SYNTHESIS OF DIGITAL SYSTEMS," Ph.D. Thesis, Princeton University, NJ, 1962; C. K. Mestenyi, "COMPUTER DESIGN LANGUAGE SIMULATION AND BOOLEAN TRANSLATION," Technical Report 68-72, Computer Science Department, University of Maryland, College Park, Md. 1968; F. J. Hill and G. R. Peterson, "DIGITAL SYSTEMS: HARDWARE ORGANIZATION AND CONTROL," John Wiley & Sons, Inc., New York, 1973. However, this control has resulted in specification language constraints, so that the specification is at a fairly low level and in closer correspondence with the implementation. This necessarily decreases the advantage of an automated approach, bringing it closer to a system for logic entry rather than logic synthesis.

Several tools have been developed to support the early part of the design cycle, e.g., as described in: M. Barbacci, "AUTOMATED EXPLORATION OF THE DESIGN SPACE FOR REGISTER TRANSFER SYSTEMS," Ph.D. Thesis, Carnegie-Mellon University, Pittsburgh, Pa., 1973; D. E. Thomas, "THE DESIGN AND ANALYSIS QF AN AUTOMATED DESIGN STYLE SELECTOR," Ph.D. Thesis, Carnegie-Mellon University, Pittsburgh, Pa., 1977; E. A. Snow, "AUTOMATION OF MODULE SET INDEPENDENT REGISTER-TRANSFER LEVEL DESIGN," Ph.D. Thesis, Carnegie-Mellon University, Pittsburgh, Pa., 1978; L. J. Hafer and A. C. Parker, "REGISTER-TRANSFER LEVEL DIGITAL DESIGN AUTOMATION: THE ALLOCATION PROCESS," Proceedings of the Fifteenth Design Automation Conference, Las Vegas, Nev., 1978, pp. 213–219; A. Parker, D. Thomas, D. Siewiorek, M. Barbacci, L. Hafer, G. Leive, and J. Kim, "THE CMU DESIGN AUTOMATION SYSTEM—AN EXAMPLE OF AUTOMATED DATA PATH DESIGN," Proceedings of the Sixteenth Design Automation Conference, Las Vegas, Nev., 1978, pp. 73–80. The technique described in the last-cited publication began with a functional description of a machine and produced and implementation in two technologies of the registers, registers operators and their interconnections, but not the control logic to sequence the register transfer. For both TTL and CMOS implementations, however, the automated implementation required substantially more chip area than existing manual designs.

There has also been recent work in logic remapping, i.e., transforming existing implementations from one technology to another. S. Nakamura et al S. Nakamura, S. Murai, C. Tanaka, M. Terai, H. Fujiwara, and K. Kinoshita, "LORES-LOGIC REORGANIZATION SYSTEM," Proceedings of the Fifteenth Design Automation Conference, Las Vegas, Nev., 1978, pp. 250–260; describe a system which will help a designer translate an existing small or medium-scale integration. However, remapping usually involves one-to-one substitution of new technology primitives for old technology primitives, and this often fails to take advantage of simplification which may be available at a higher technology-independent level.

U.S. patent application, Ser. No. 631,364, filed Jul. 16, 1984, entitled, "LOGIC SYNTHESIZER" which application is assigned to the assignee of the present invention sets forth a logic synthesis method in which a register-transfer level flowchart specification is translated in a straightforward manner into a simple AND/OR logic implementation. After expanding the logic implementation to elementary representation and then applying textbook simplifications, the simplified AND/OR implementation is translated to a NAND or NOR implementation, depending on the target technology. The NAND or NOR implementation is then simplified by applying a sequence of simplification transformations which achieve satisfactory results, with the transformation sequence being modified to achieve "normal," "fast" or "small" logic designs. After simplification at the NAND/NOR level, the logic implementation is then translated to the target technology and further simplified. The result is an interconnection of the primitives of the target technology in a language from which automated logic diagrams can be produced in a known manner, and which can be submitted to existing programs for automated placement and wiring and chip fabrication.

According to the present invention, a method is set forth for taking a provided logical design or an original circuit implementation as set forth in U.S. Patent application, Ser. No. 631,364 set forth above, and producing therefrom a final circuit implementation which is the functional equivalent of, and contains fewer corrections than, the original circuit implementation. This is the result of approaching connection minimization globally rather than utilizing local transformation as in the prior art. For example, a semiconductor chip such as a master slice chip which is connected in a given circuit configuration has the number of connections between elements minimized. Stated another way, the idea is to minimize connections between terminals or nodes on the master slice chip. Each of n signals is processed in a circuit configuration sequentially. For each such signal in the given circuit a derived graph is constructed. The minimal cut of the derived graph is found, and this cut is utilized to optimize the circuit. The next signal is processed in the optimized circuit, and this procedure is repeated until all n signals have been processed. The resulting optimized circuit is the functional equivalent of the original circuit, but has fewer connections.

DISCLOSURE OF THE INVENTION

A provided network configuration includes n signals and m nodes. A final network configuration is produced therefrom which is the functional equivalent of, and contains fewer connections than, the provided network configuration. Global information is computed relative to a given one of the n signals, and a derived graphical representation of connections between the m nodes is generated from the global information. A list of nodes that form a cut-set of the derived graph is produced from the graphical representation, and a new network is provided as a function thereof. Each of the remaining ones of the n signals are processed sequentially, as above, to form successive new networks with the processing of the final signal resulting in the final network configuration.

BEST MODE FOR CARRYING OUT THE INVENTION

A system is set forth for minimizing the connections in an original or a provided logical design. The design may come from any source, for example, a logic design system, with the idea being to produce an optimized logical design which is the functional equivalent of the original or provided logical design, but which has fewer connections. This is accomplished in the practice of the invention, by a method which may be practiced on a properly programmed computer such as the IBM System/370 data processing system, as defined by the "System/370 Principles of Operation", Form No. GA22-7000. It is to be appreciated, however, that the invention may be practiced on any general purpose computer or machine.

Figure 1:
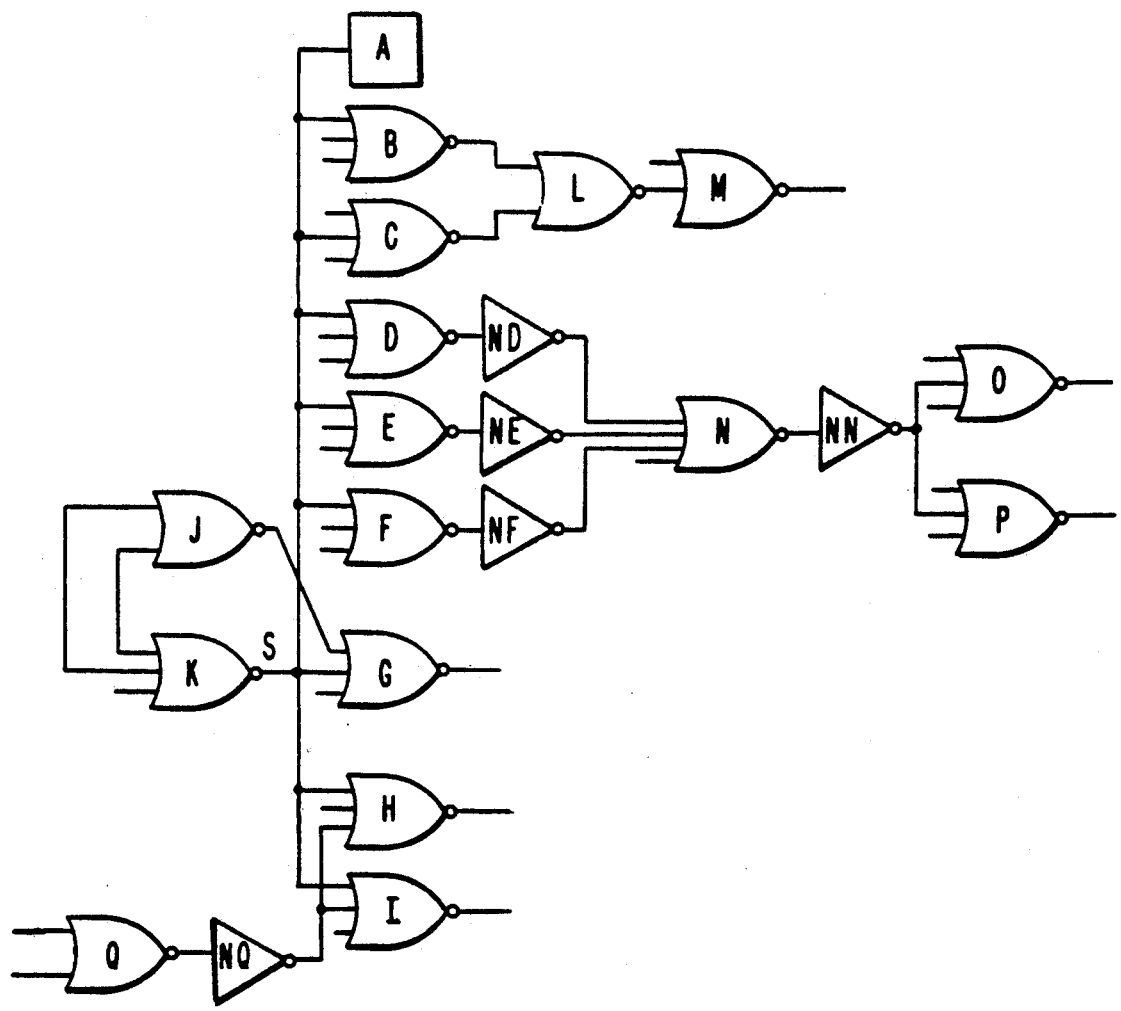
FIG. 1 is a schematic diagram of a provided logic circuit implementation in a given technology.
Figure 2:
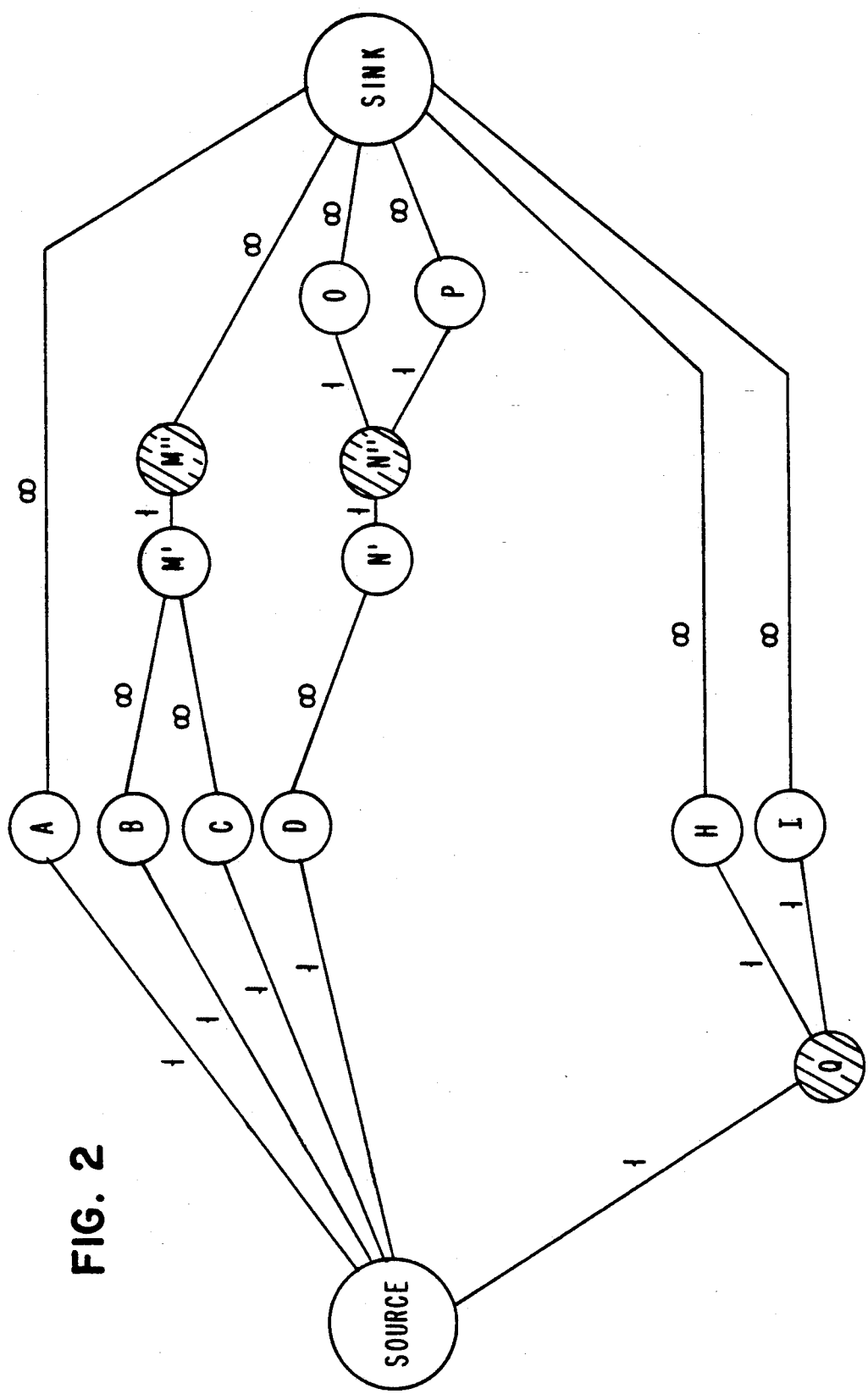
FIG. 2 is a derived graph of the logic circuit of FIG. 1.
Figure 3:
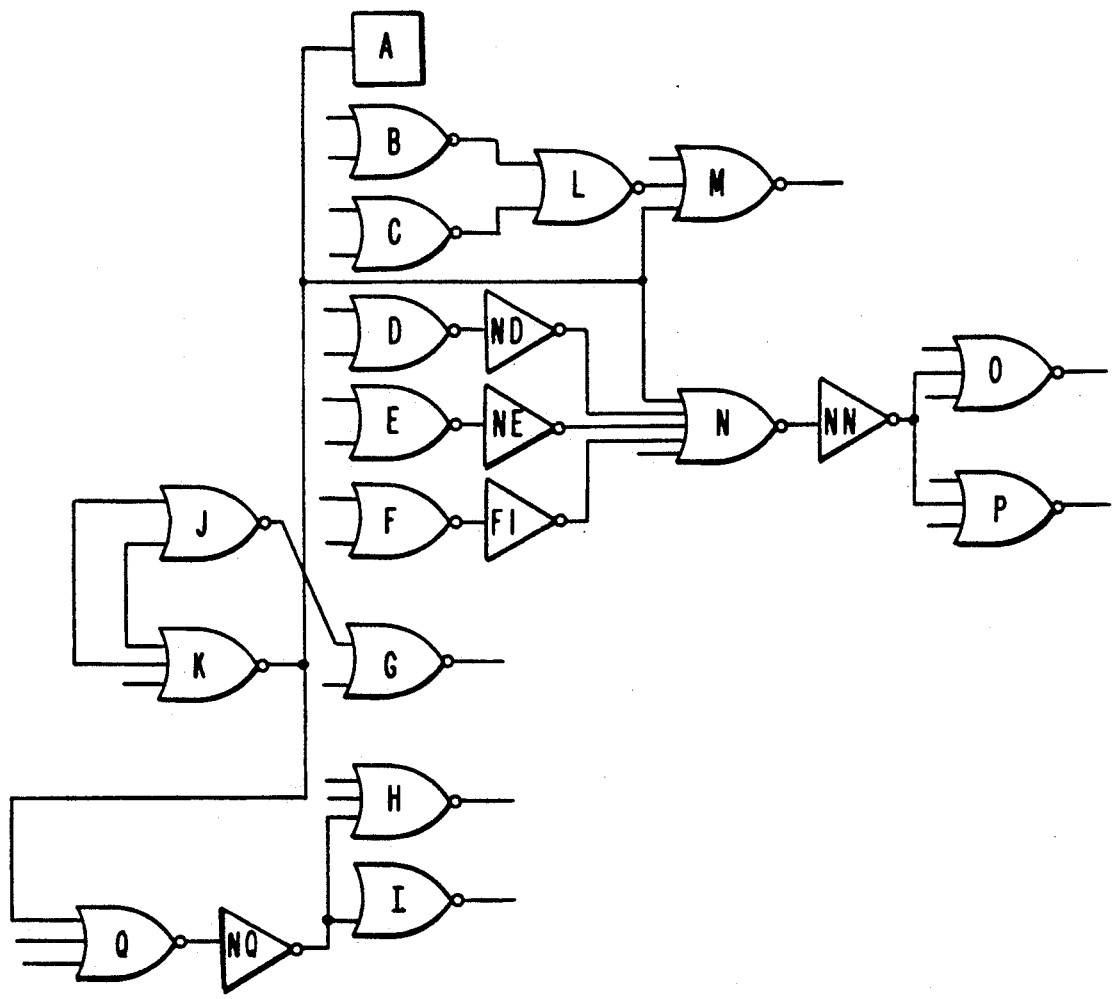
FIG. 3 is a schematic diagram of an optimized logic circuit implementation, which is the functional equivalent of the logic circuit of FIG. 1, but which has fewer connections.

A provided or original logical design or circuit, as shown in FIG. 1 which includes n signals and m nodes has global information computed relative to a given one of the n signals. A derived graph of connections between nodes, as shown in FIG. 2, is constructed from the global information. A list of nodes in the derived graph that form a cut-set are found and a new logical design is produced therefrom. Each of the remaining ones of the n signals are processed sequentially, as above, to form successive new logical designs, with the processing of the nth signal resulting in an optimized logical design as shown in FIG. 3.

Stated another way, it is determined which of the m nodes comprise FRONTIER nodes for a given one of the n signals in the original logic circuit. Then, a different set of connections is determined which generate the same set of FRONTIER nodes for the given one of the n signals. Next, the original set of connections in the original circuit are replaced with the different set of connections for producing a different logic circuit. Finally, the above is repeated for each of the remaining ones of the n signals, with the original logic circuit, being replaced by the different logic circuit, with the completion of the repetition of steps resulting in a new or optimized logic circuits. The detailed description that follows describes how the design of FIG. 1 results in the derived graph of FIG. 2 and finally the optimized design of FIG. 3.

Figure 4:
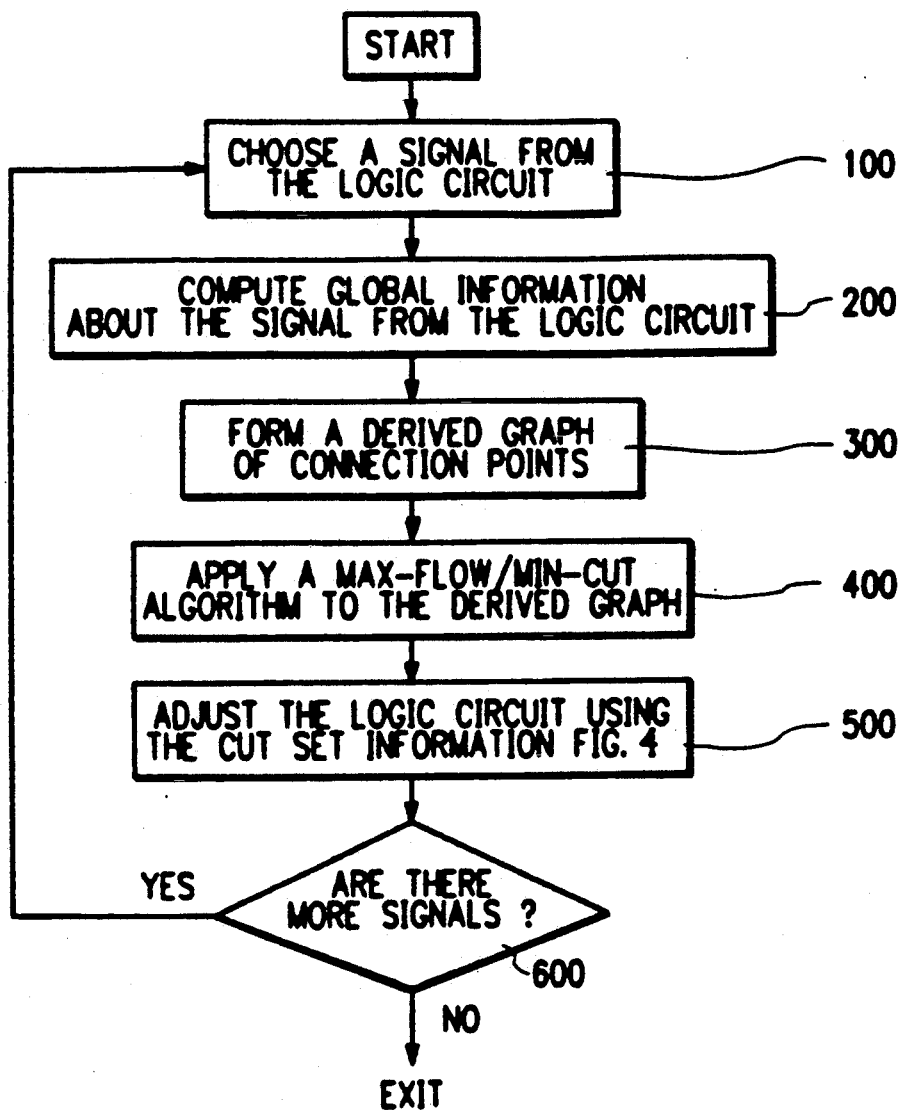
FIG. 4 is a flow chart which is indicative of the connection reduction overview of the method of the invention.

Refer now to FIG. 4 which is a flow chart of the connection reduction overview of the invention. The method starts, and at 100 one of the n signals is chosen for processing, for example the signal s of FIG. 1. At 200 global information is computed relative to the chosen signal. Next, at 300 a derived graph of connections points, as in FIG. 2, is formed from the computed information. a max-flow/min-cut algorithm is applied to the derived graph at 400. The provided logic circuit is adjusted according to the cut-set information. At 600 it is determined if there are any more of the n signals remaining. If so, the method returns to 100 and the process is repeated for each of the remaining n signals. The nth iteration results in an adjusted logic circuit as 500 which is the optimized logic design as in FIG. 3.

The details of the method of FIG. 4 are set forth below relative to FIGS. 5-14.

At the highest level, the method is organized into two phases. The first phase computes information concerning the signals in the circuit under consideration. The information which is computed is described below. In the second phase of the method, a minimal set of connections is determined which results in the same global forcing information at certain key nodes, for example FRONTIER nodes. The main theoretical result, guarantees that if the circuit is changed in such a way that this global information is unchanged at these key nodes, then the circuit computes the same function and this permits the connections of the circuit to be altered safely. The method is designed for a circuit described in terms of NORs; however, this is only for clarity of presentation and is not a limitation of the method itself.

The second phase itself is divided into three parts. First, a graph is built which contains the forcing information (the construction of a "derived graph" as described below), second, a standard MINCUT algorithm is used to find a minimum cut-set of the derived graph, and third the cut-set is used to optimize the circuit.

DATA STRUCTURES

The method proceeds through the signals of the circuit one by one. The signal currently being processed is referred to as the current signal. In the flow charts the current signal may be referred to as SIG or "SIG". During the processing of each signal, the following data structures are needed. A stack is utilized to hold names of other signals which are encountered during the processing of the current signal. In addition, for each signal in the circuit, a data structure is utilized which holds the following information. This data structure is reinitialized during each pass through the method.

DATA STRUCTURE FOR EACH SIGNAL 1. fan-in of the gate which produces the signal.
2. fan-out of the signal.
3. whether the signal is FORCED ONE. (This means that if current signal is "1", the signal will be forced to "1".)
4. whether the signal is FORCED ZERO. (This means that if current signal is "1", the signal will be forced to "0".)
5. whether the signal is FREE. (This describes whether all connections of the current signal in the tree driving signal can be removed without changing the value of the signal. If the signal is FREE all connections can safely be removed.)
6. whether the signal is FRONTIER. (This tells whether the effect of the current signal must be observable at this signal or whether it can be masked by connections of the current signal later in the cone of influence. If a signal (node) is FRONTIER the effect of the current signal must be observable at the signal.)
7. whether the signal is BLOCKED. (This refers to whether a connection of the current signal at the source of this signal would change the output of the circuit. If it is BLOCKED a connection would not change the output.)
8. whether the signal is chosen. (This refers to those nodes for which a node called DG (node) is placed into the derived graph and which have an edge from the source to DG (node). These are among the signals which may end up with the current signal as input.)
9. estimate of the value of a direct connection to the gate producing the signal. w.e
10. estimate of the value of a direct connection to a gate producing an input to the gate producing the signal. w.o
11. number assigned to the signal in some topological ordering of signals in circuit.

w.e and w.o are used since there are many places where a signal may be connected in a circuit all of which yield equivalent logic. The goal of optimization is to find a set of connections which minimize some objective function. These values are related to the objective function which has been chosen.

I. Information collection

The respective signals of the circuit are processed sequentially, with information for each signal being collected, and then the connections of that signal are optimized. In speaking of the method a signal is identified with the node which produces that signal. This allows reference to the inputs of a signal. Note that the FORCED ZERO and FORCED ONE are reused with slightly different meanings during the second phase (construction of the derived graph) of the method.

Figure 5:
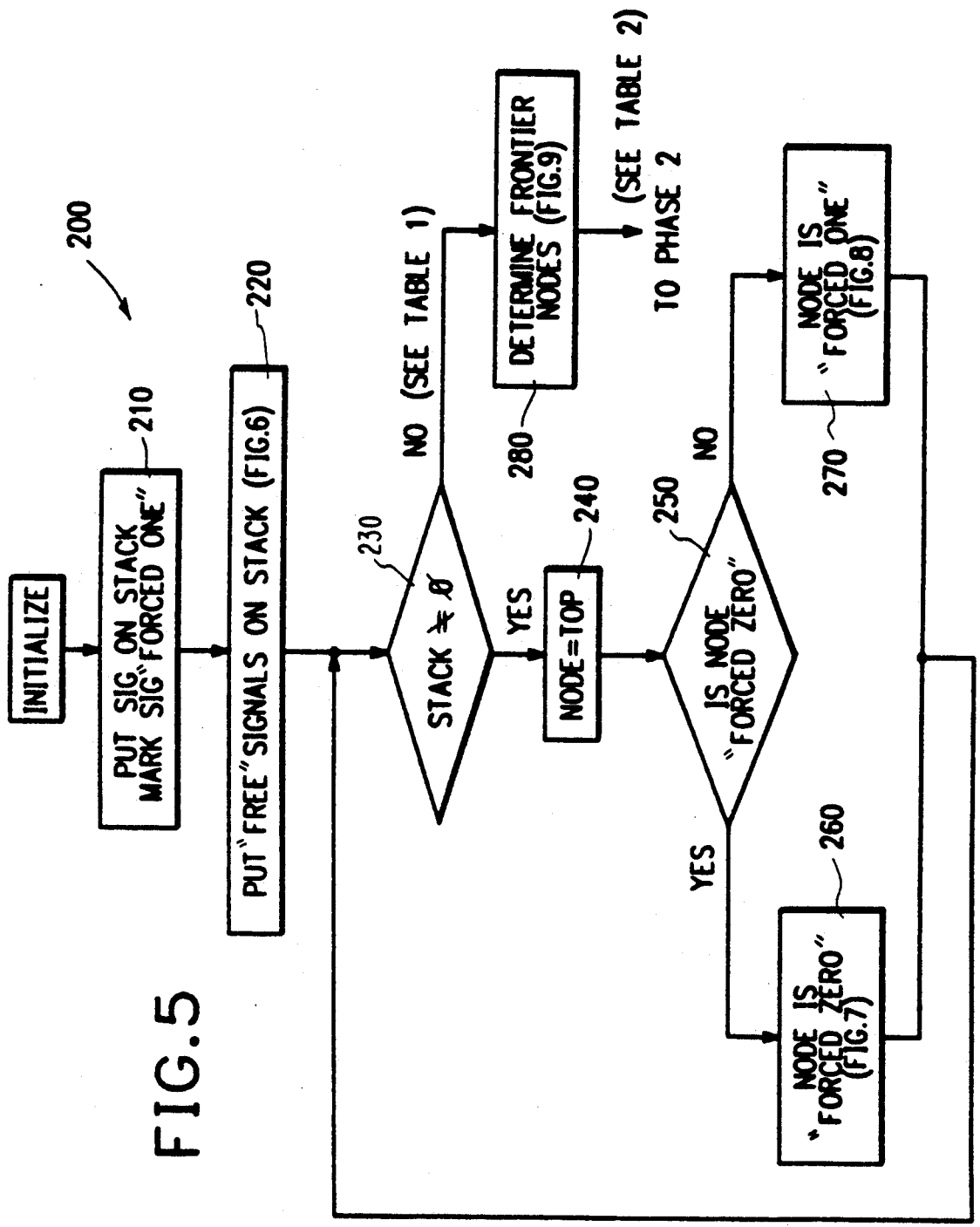
FIGS. 5 through 9 are flow charts which are indicative of the first phase of the method according to the invention, which computes global information relative to the logic circuit of FIG. 1.
Figure 6:
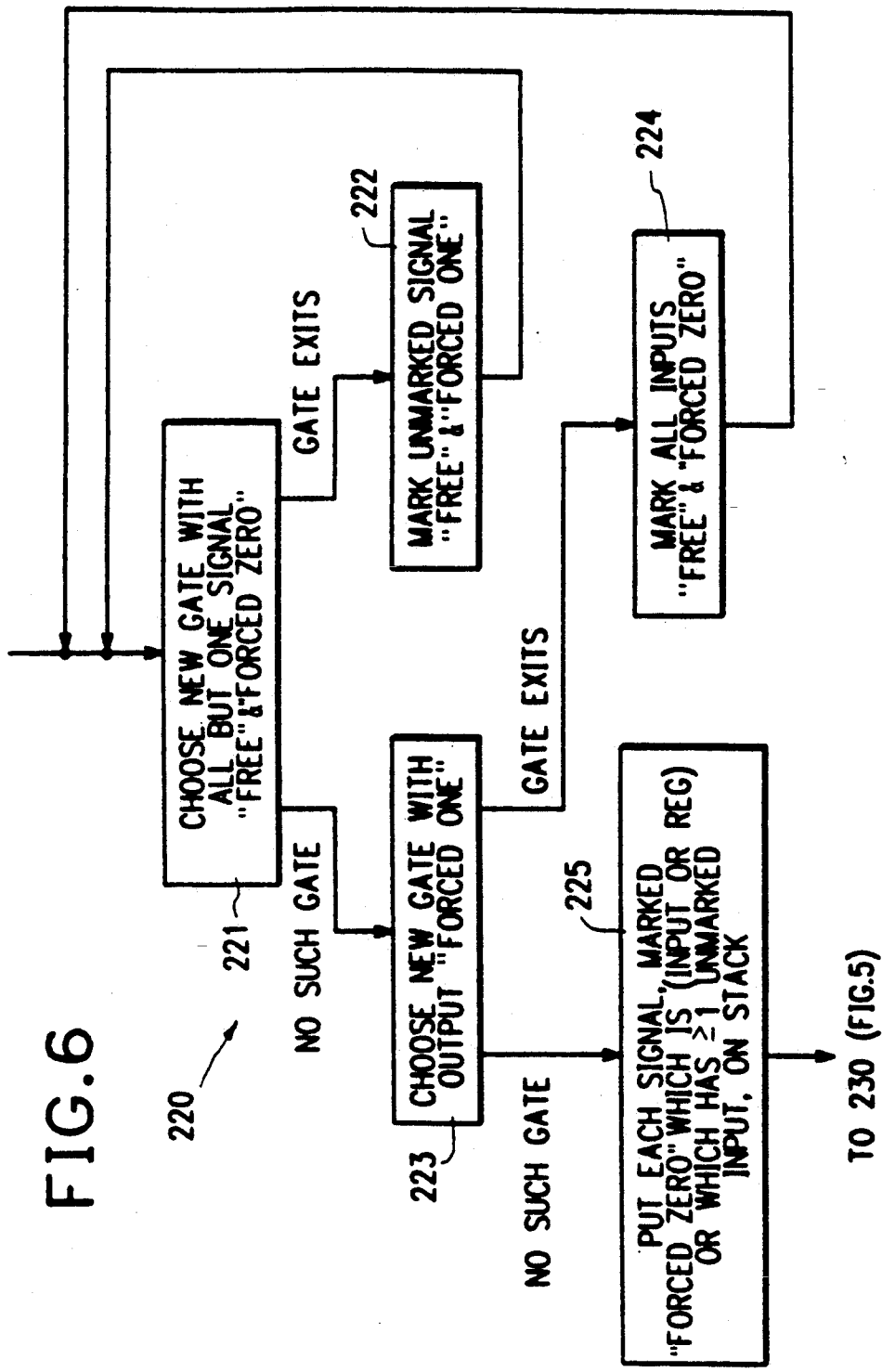

Refer now to FIG. 5 for the process of computing global information for each signal in the original circuit of FIG. 1, and as indicated generally at 200 of FIG. 4. First, the current signal is put on the stack, and marked "FORCED ONE", as indicated at 210. Next at 220, "FREE" signals are put on the stack. Refer now to FIG. 6 for the detailed flow chart of 220. As indicated at 221, an unprocessed gate is found, if one exists, such that all but one of the signals connected to this gate, both inputs and outputs, are marked FORCED ZERO. If such a gate exists, then as indicated at 222 the unmarked signal is marked FORCED ONE and 221 is repeated. If no such gate exists, then as indicated at 223 find an uprocessed gate with output marked FORCED ONE, and if such a gate exists then as indicated at 224 mark all inputs FORCED ZERO and repeat 221. If no such gate exists, then as indicated at 225 put those signals, which are the output of a non-combinational gate on the stack. In addition, put those signals on the stack which are marked FORCED ZERO and whose generating boxes have at least-one input which is not marked. Also mark each signal on the stack, other than the current signal as FREE. Note that if during the procedure of 220 a signal is ever marked FORCED ONE and FORCED ZERO this indicates a contradiction is discovered and SIG is set to ZERO in the circuit, and the process moves to the next signal.

Figure 7:
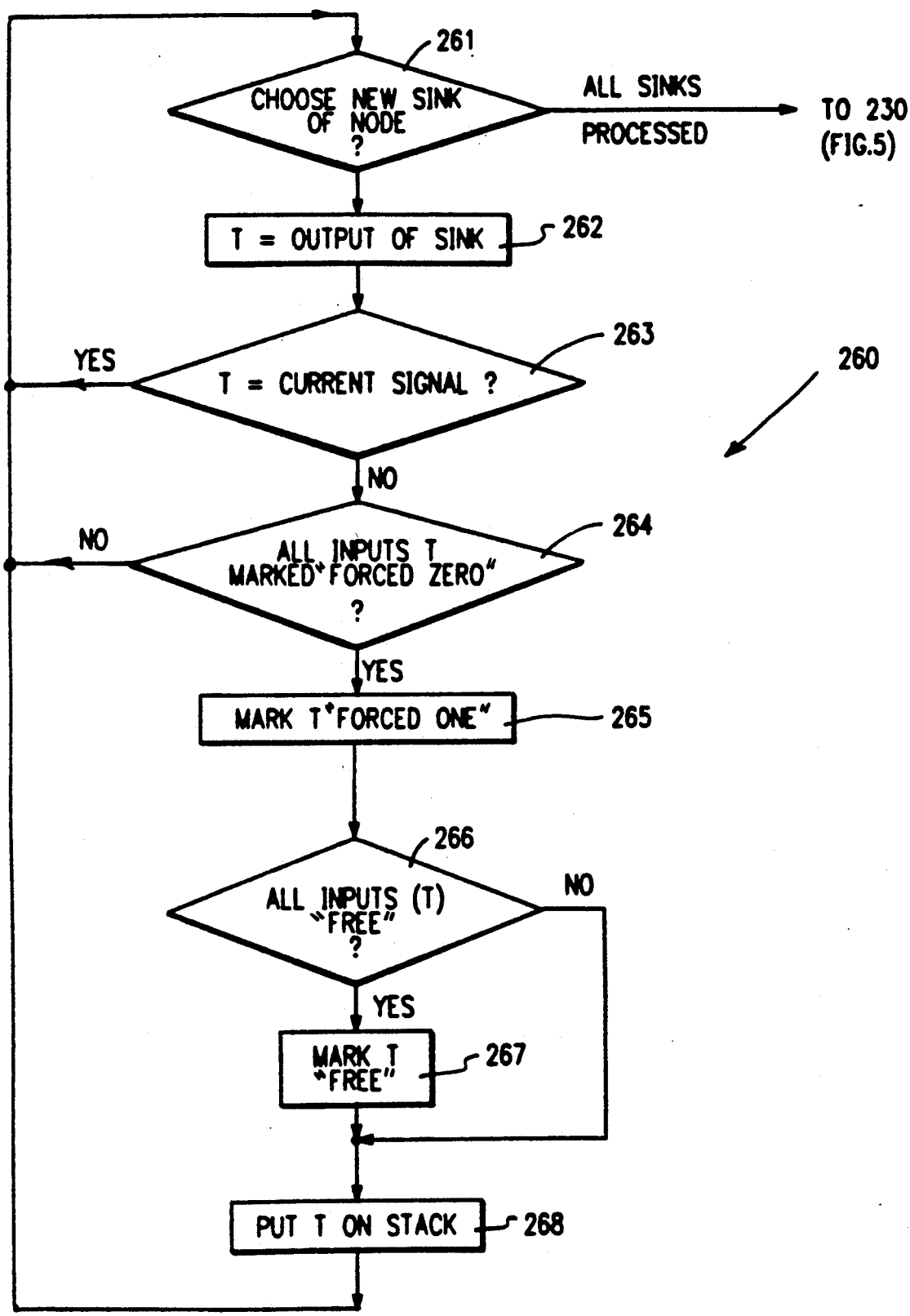

Return now to FIG. 5. The next stage is the main part of the information collection portion of the method. It is a loop which discovers the forcing information which is used to rearrange connections. The loop can be implemented in many ways, and for purposes of description a stack is chosen as indicated at 230. If the stack is not empty, the top element is removed from the stack (this element will be named by the variable NODE) and the operation proceeds as follows: As indicated at 250 a test is made to determine if the NODE is FORCED ZERO, if it is then go to 260 otherwise go to 270. Refer now to FIG. 7 for the condition when the node is FORCED ZERO. As indicated at 261, an unprocessed sink of NODE is chosen and T is its output as indicated at 262. If no such unprocessed sink exists, all sinks are processed and a return is made to 230 of FIG. 5. If T is the current signal a return is made to 261. If not, proceed from 263 to 264. If some input of T is not marked FORCED ZERO then return to 261. Otherwise mark T FORCED ONE at 265 and proceed to 266. If every input of T is FREE then mark T FREE at 267, if not proceed to 268. Finally, put T on the stack at 268 and return to 261. When all sinks are processed return to 230 of FIG. 5.

Figure 8:
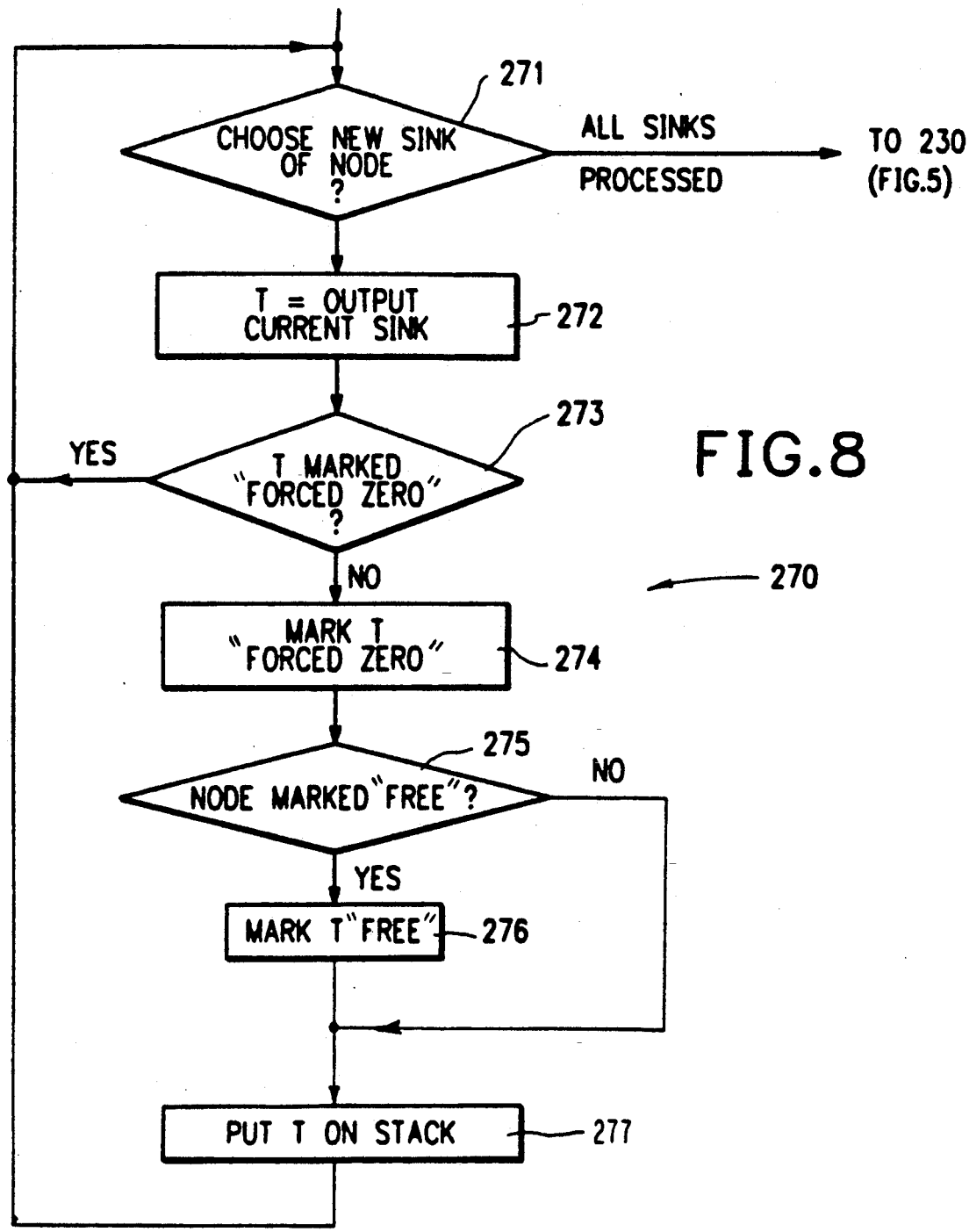

Refer now to FIG. 8 for the condition when the node is FORCED ONE as indicated at 270 of FIG. 5. As indicated at 271, choose an unprocessed sink of NODE and let T be its output as indicated at 272. If no such unprocessed sink exists, return to 230 of FIG. 5. At 273, if T is marked FORCED ZERO, then return to 271, otherwise Mark T FORCED ZERO as indicated at 274 and go to 275. If NODE is FREE then mark T FREE as indicated at 276. Finally, put T on the stack as indicated at 277 and return to 271. If the stack is empty, at 230 this indicates the computation of all the forcing information is complete. Table 1 indicates the node markings at the entry to 280 of FIG. 5.

Figure 9:
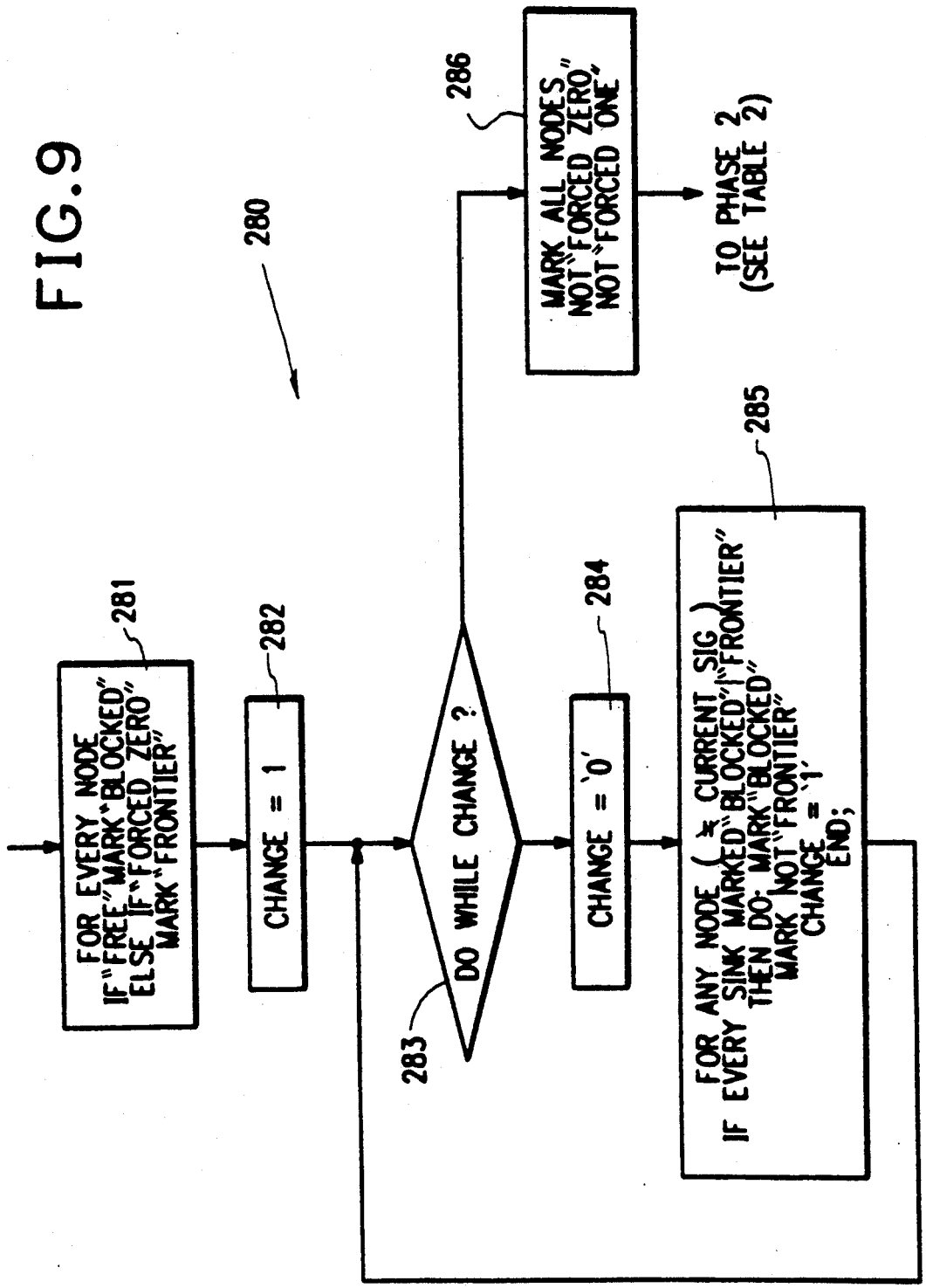

Refer now to FIG. 9 for a detailed determination of FRONTIER nodes, as indicated generally at 280 of FIG. 5. A FRONTIER node is a node which is forced to ZERO by a given signal and from which there is a path to a register, or output to other nodes which are not forced to ZERO. Initially, as indicated at 281 mark each FREE node as BLOCKED and each FORCED ZERO node as FRONTIER. A loop 283 is entered until there is no further change in the data structures. In this loop for each node, as indicated at 285, if every sink of the node is marked BLOCKED or FRONTIER, mark the node BLOCKED and not FRONTIER. When the loop is complete, proceed to 286 and mark all nodes NOT FORCED ZERO, NOT FORCED ONE. This complete phase one.

At this point the forcing information has been used, and the FRONTIER information has been computed which permits the construction of the derived graph of FIG. 2. The optimization of the logical circuit may now proceed. The FORCED ZERO and FORCED ONE arrays are reinitialized and the construction of the derived graph proceeds as set forth below.

II. Construction of Derived Graph

In what follows it is important to maintain the distinction between nodes in the original circuit of FIG. 1 and nodes in the derived graph of FIG. 2. This is done by always using the terms node, sink of node, predecessor of node, etc. to refer to elements of the original circuit and using the expressions DG (node), DG (sink), etc. to refer to nodes in the derived graph of FIG. 2 which correspond to node or sink in the original circuit of FIG. 1.

In addition, the FORCED ZERO and FORCED ONE fields are reused in a slightly different context. The goal is to produce a derived graph which incorporates enough information to make each FRONTIER Node FORCED ZERO. In this phase at each point the FORCED ZERO and FORCED ONE fields reflect only the forcing which is entailed by the derived graph as it exists up to that point.

Figure 10:
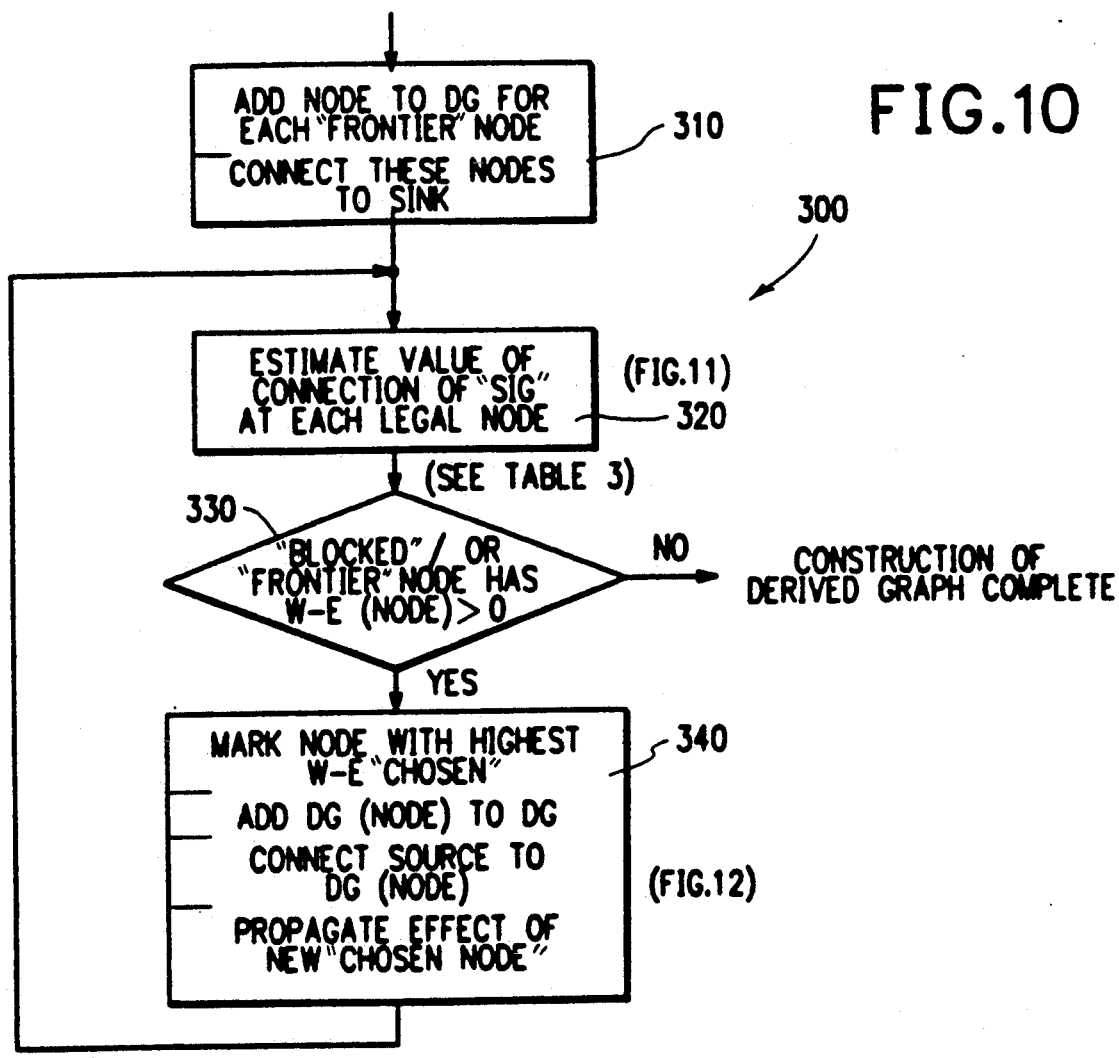
FIGS. 10 through 12 are flow charts which are indicative of how the derived graph of FIG. 2 is arrived at in the first steps of the second phase of the method according to the invention.

Construction of the derived graph comprises three steps as shown in FIG. 10. First, as indicated at 310, nodes corresponding to the FRONTIER Nodes of the circuit are inserted into the derived graph. After this is done, an iterative procedure is used. Second, as indicated at 320, the value of a connection of the current signal at each legal node in the circuit is estimated. Third, as indicated at 340 the node with the highest value is chosen, a corresponding node is inserted into the derived graph, and the derived graph is updated to reflect all forcing due to nodes currently represented in the derived graph. When this is complete, a return is made to 320. The procedure ends when, at all legal nodes, the value of the connection is zero.

Initially, two nodes are placed in the derived graph. One is labelled SOURCE and one is labelled SINK. Then as indicated at 310, for each node labelled FRONTIER in the original circuit, DG (node) is added in the derived graph. Edges are added from each of these nodes to the node labelled SINK.

Figure 11:
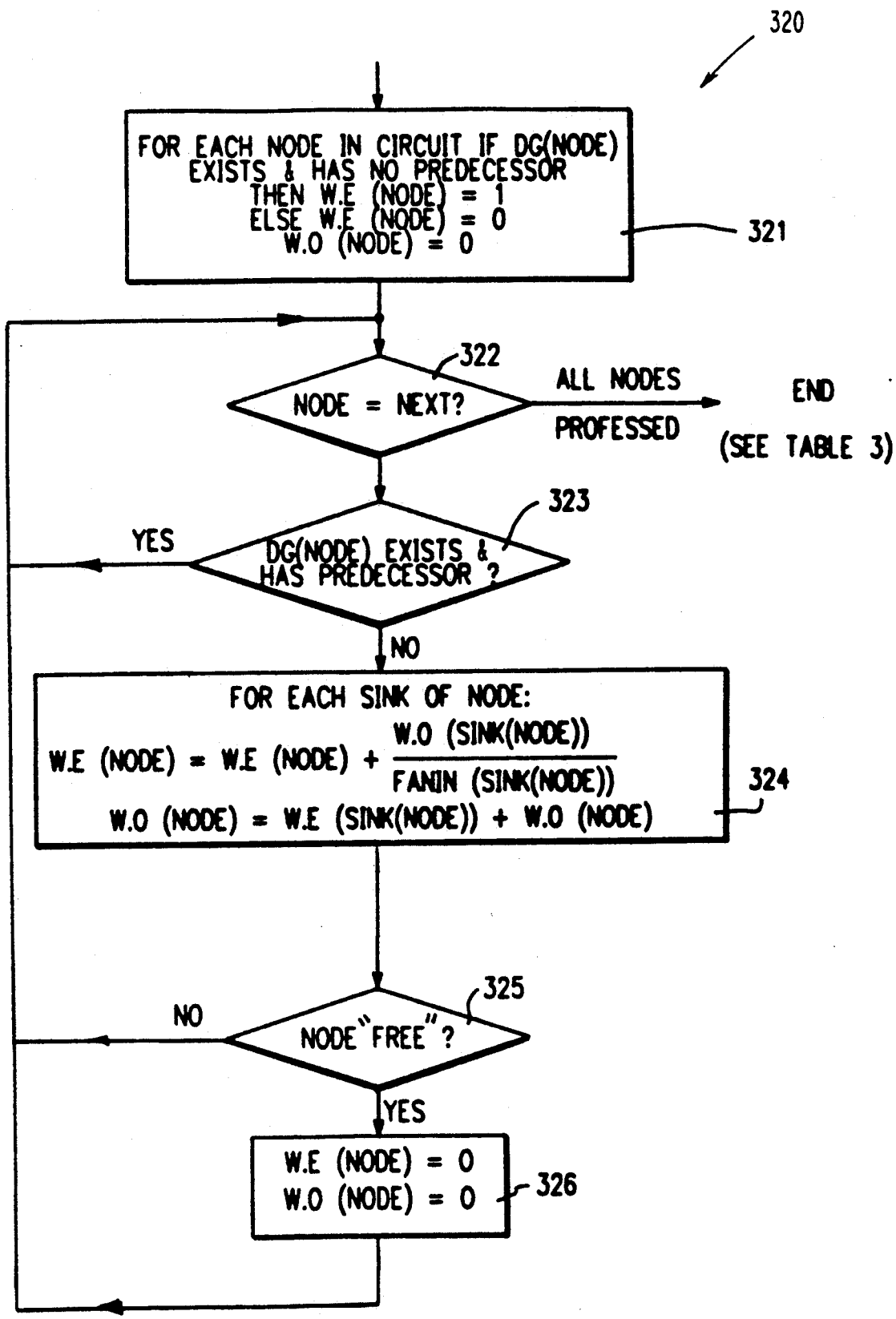

In order to estimate the value of a connection at a node in the original circuit, as indicated at 320, the data fields w.e and w.o, mentioned earlier, are made use of. Refer now to FIG. 11 for a detailed description of 320. First, w.e and w.o are set to zero for each node. Then, as indicated at 321, for each node in the circuit, with a corresponding node DG (node) in the derived graph, if DG (node) has no in-edges, set w.e (node)=1. The nodes of the circuit are then processed in reverse topological order as indicated at 322, beginning at the nodes which had w.e (node) set to 1 in the previous step and working backward towards the inputs and registers. Note, that if a node is FREE then w.e remains 0. If DG (node) has a predecessor in the derived graph, as indicated at 323, make no changes to w.e or w.o and choose the next node in the topological sweep. If the node has no corresponding node, DG (node), in the derived graph or if it has a corresponding node but DG (node) has no predecessor, update w.e and w.o with the formula shown in 324. If the node is FREE as tested at 325, proceed to 326 and set w.e and w.o to zero. Return to 322, and when all nodes are processed, w.e will hold an estimate for the value of a connection at any node of the circuit.

Figure 12:
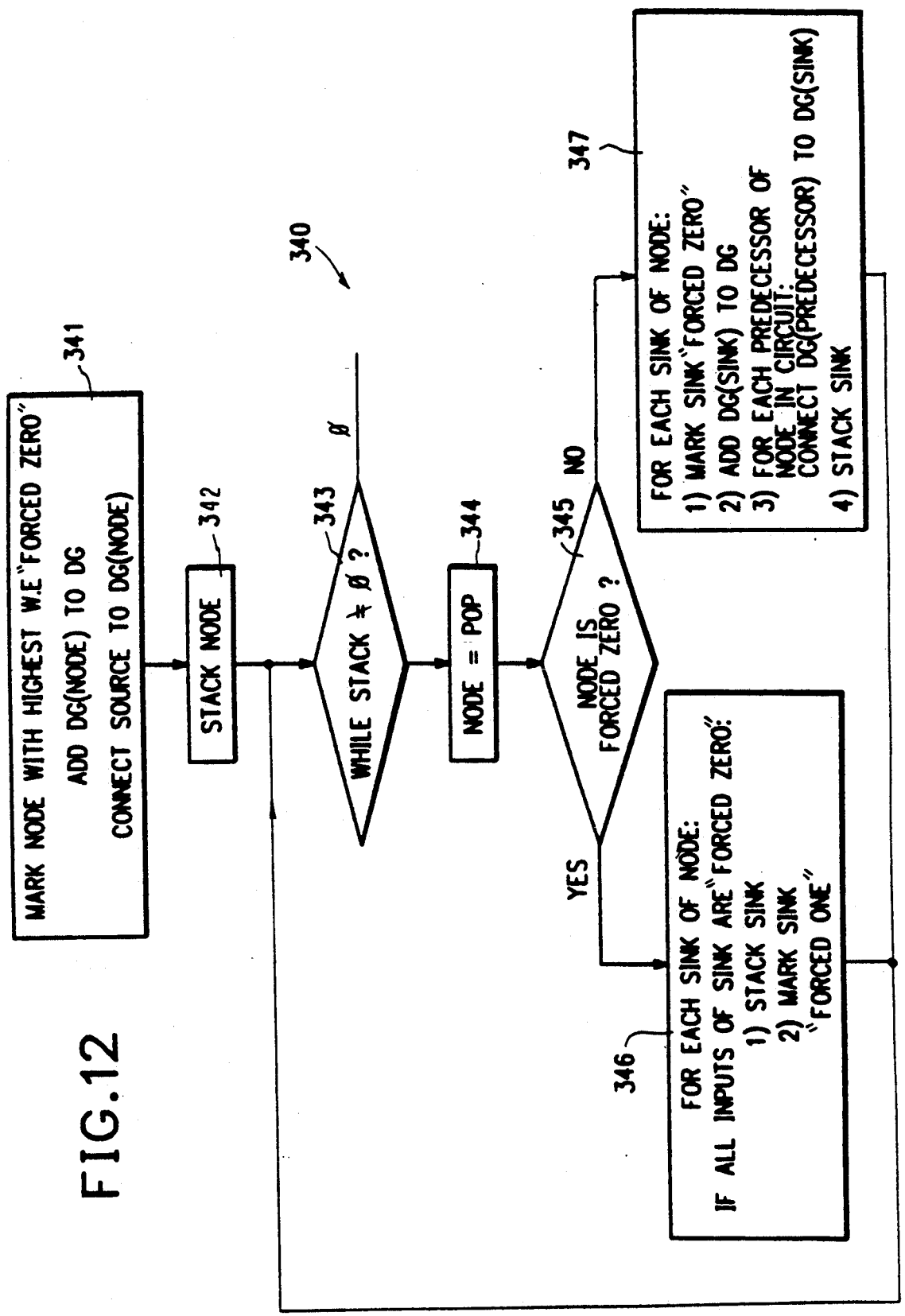

Return now to FIG. 10, and 330 a determination is made if a "BLOCKED" or "FRONTIER" node has w.e (node)>0. If not the derived graph is complete, if so proceed to 340. The loop is now entered which completes the construction of the derived graph. During each iteration of the loop 1 or more edges are added to the derived graph. Refer now to FIG. 12 which shows 340 in detail. At 341, the node with largest w.e (node) is chosen. This node is marked CHOSEN and FORCED ZERO and a corresponding node, DG (node), is added to the derived graph. In the derived graph, an edge is put from the SINK to DG (node). The node is pushed on the stack at 342. The effect of adding this node is propagated in the loop headed at 343. While the stack is not empty, the top element from the stack is chosen at 344. Then at 345 it is determined if the node is FORCED ZERO. If it is FORCED ZERO then proceed to 346, and for each sink of the node in the circuit, if every input of the sink is marked FORCED ZERO, then mark the sink FORCED ONE and push the sink on the stack. If the node is FORCED ONE then proceed to 347 and for each sink of the node in the original circuit do the following: 1) add a corresponding node, DG (sink), to the derived graph if one is not present, 2) mark the sink FORCED ZERO, 3) for every predecessor of the node in the circuit connect DG (predecessor) to DG (sink), 4) push sink onto stack. Now return to 343. When the stack is empty, one iteration of the loop headed at 320 is complete, and a return is made to 320 of FIG. 10. When no node has w.e>0, the construction of the derived graph is completed as indicated by the N line of 330.

III. Max-Flow/Min-Cut Algorithm

Figure 13:
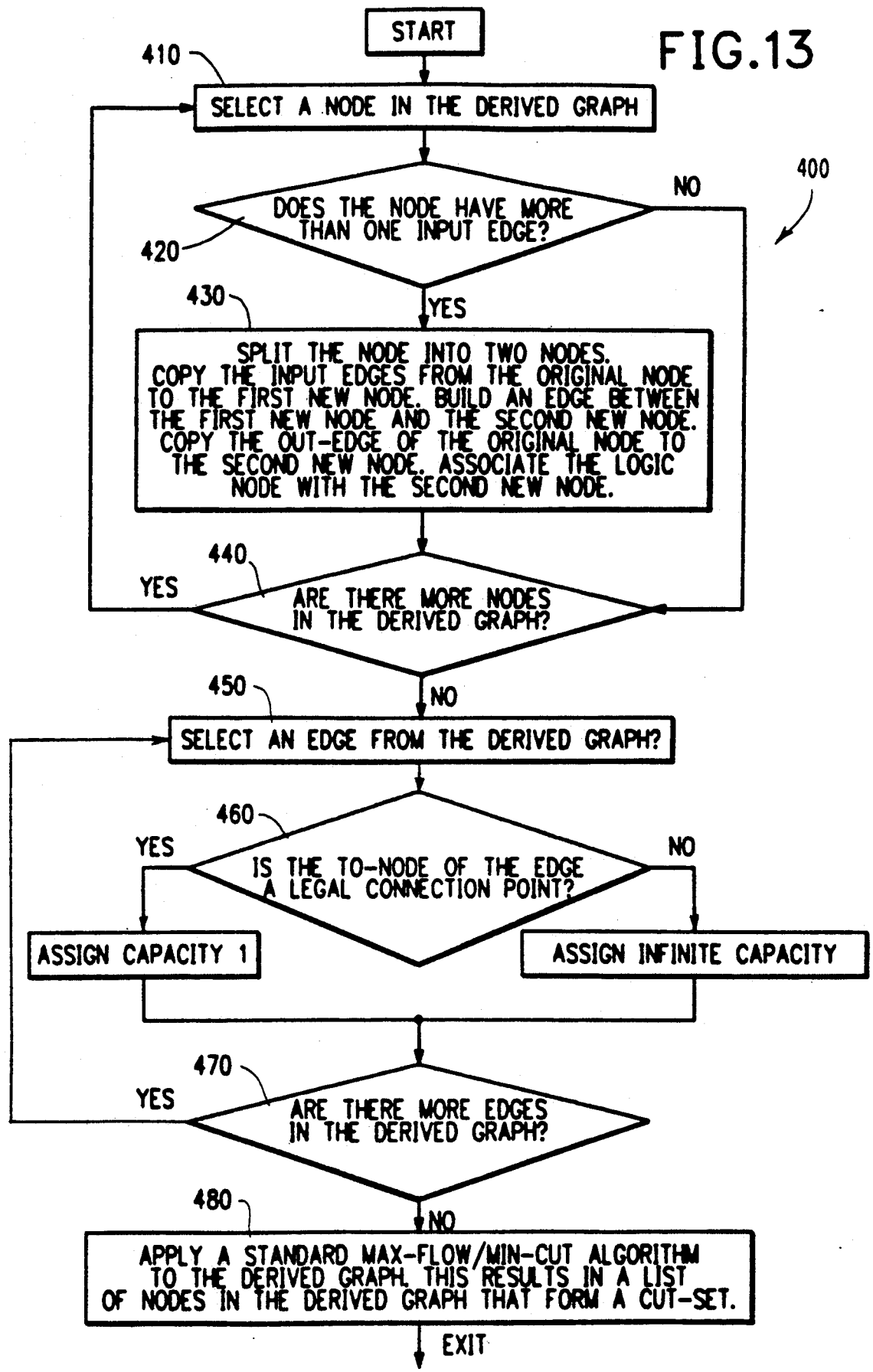
FIG. 13 is a flow chart which is indicative of the max-flow/min-cut processing in the second step of the second phase of the method according to the invention.

When the derived graph has been completed, it is prepared for the application of a standard max-flow/-min-cut algorithm. One such algorithm is described in an article entitled "FLOWS IN NETWORKS," Princeton University Press, Princeton, N.J., 1962 by S. R. Ford and D. R. Fulkerson. Refer now to FIG. 13 for the process utilized in the invention. In the usual formulation of max-flow/min-cut problems, the flow capacities are on edges of the graph, but in the derived graph, the capacities are on the nodes. In 410-440, the derived graph is converted to one with edge capacities by splitting each node N that has more than one in-edge into two nodes, N' and N", with an edge between them. N' has the same in-edges as N, but has only one out-edge. N: has only the in-edge which corresponds to the out-edge of N', but it has the original out-edges of N. The edge between N' and N" will carry the capacity associated with derived graph node N.

Next, edge capacities are assigned, as set forth in 450-470, to each edge as follows:
1. If the to-node of the edge corresponds to a legal connection point in the derived graph, give it capacity 1.
2. Otherwise, the edge has infinite capacity. This includes all of the edges into the N' nodes that were described above, because they do not correspond to any point in the logic graph. It also includes edges to the sink node of the derived graph, and edges which correspond to connections of a signal to a non-NOR node in the logic graph.

Edges are assigned capacity 1 because the algorithm is only minimizing connections. Other weighting functions could also be used to take area and timing into consideration.

Finally, the max-flow/min-cut algorithm is applied to the modified derived graph at 480. The result of this is a list of nodes in the derived graph, called a cut-set, which corresponds to the places that the signal should be connected in the original logic graph.

IV. Optimize Circuit

The "Optimize Circuit" phase is responsible for posting the information from the max-flow/min-cut algorithm back into the original circuit. It takes the cut-set as input, and must assure that the signal is connected to only the nodes in the original circuit that correspond to nodes in the cut-set of the derived graph. This results in the optimized circuit.

Figure 14:
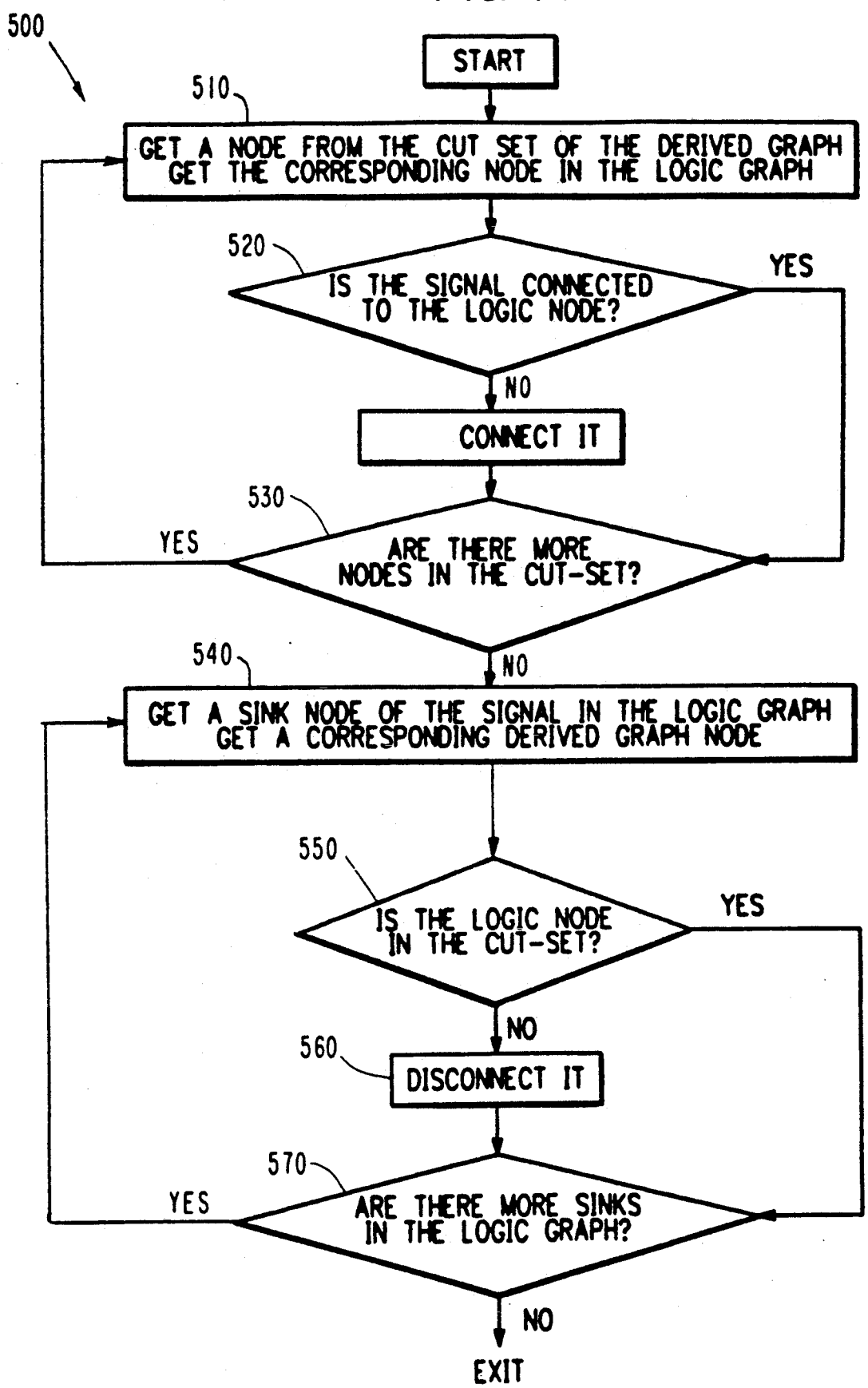
FIG. 14 is a flow chart which is indicative of how the optimized logic circuit of FIG. 3 is arrived at in the third step of the second phase of the method according to the invention.

Refer now to FIG. 14 for the optimization procedure. First, it sequences through the cut set 510-530. For each derived-graph node in the cut-set, it obtains the corresponding node in the original circuit. If the signal is not connected to the circuit node, it connects it there.

Finally, it sequences through the connections of the signal in the original circuit as shown at 540-570. For each connection to a circuit node it obtains the corresponding derived graph node. If the derived graph node is not in the cut-set, it disconnects the signal from the circuit node. This results in an optimized circuit where there are only connections found in the cut-set.

A specific example will now be set forth to show how a provided logic network is optimized. As previously stated FIG. 1 shows an example of a provided logic network. All of the devices except the box labelled A represent NORs. Box A represents some non-NOR construct such as a latch or an off-chip driver. In the example, the method or algorithm of the invention is applied to show how the connections of a signal S are optimized. Initially, S is an output from NOR box K, and is connected to 9 boxes: A,B,C,D,E,F,G,H and I.

The behavior of the method of the invention is described below relative to the iteration in which the signal "s" shown in FIG. 1 is processed. In what follows, signals are named according to their source boxes or position which they have as input to a box. For example, signal "s" can also be called K.OUT, G.IN.2, or E.IN.1. These names will be used interchangeably.

The iteration is started with SIG="s". Refer now to FIG. 5, where "s" is put on the stack and marked FORCED ONE at 210. Proceed next to 220 where FREE signals are added to the stack.

For detailed operation of 220 now refer to FIG. 6. The test at 221 is made, and the NO.SUCH.GATE exit to 223 is taken. Node K satisfies the test, so proceed to 224 and mark K.IN.1, K.IN.2, and K.IN.3 FORCED ZERO. Then return to 221 where gate J now satisfies the test. Now since the gate exists, take the exit to 222 and mark signal J.OUT as FORCED ONE. Return again to 221 and take the NO.SUCH.GATE exit to 223. Then from 223 take the NO.SUCH.GATE exit. (Both of these exits were taken because of the requirement that a gate be "new", i.e., not previously "processed" to satisfy the test.). Next, go to 225 where K.IN.1, K.IN.2, and K.IN.3 are put on the stack and return to 230 in FIG. 5.

The stack is not empty as tested at 230 so assign K.IN.3 to NODE at 240. At the test at 250 it is seen that the NODE is FORCED ZERO so go to 260. Refer now to FIG. 7 for the details of 260. At 261 K is the sink of K.IN.3. Set T=K.OUT at 262 and in 263 it is seen that T is the current signal so return to 261 where it is determined that all sinks of K.IN.3 have been processed, so return to 230 of FIG. 5.

At 230 the stack is again not empty and K.IN.2 is assigned to NODE at 240. At 250 NODE is again FORCED ZERO so go to 260 as before.

Returning to 261 of FIG. 7, eventually T=J.OUT. Then proceed through 263 to 264 where it is found that some input of T is not marked FORCED ZERO so return to 261 and then to 230 of FIG. 5. Continue taking K.IN.1 from the stack and eventually return to 264 of FIG. 7 with T=J.OUT. This time every input of T is marked FORCED ZERO so go to 265 and mark T (=J.OUT) as FORCED ONE. At 266 it is found that all inputs of T are marked FREE and so mark T FREE at 267. Finally, put T on the stack at 268 and return to 261 and then to 230 of FIG. 5 as before.

Proceed through 230, assign NODE=J.OUT, at 240 and proceed through 250 to 270. Refer now to FIG. 8 for the detail of 270. At 271 choose G, the only sink of the NODE, and then set T=G.OUT at 272. In 273 it is found that T is not marked FORCED ZERO. In 274 mark T FORCED ZERO. In 275 since NODE is FREE, mark T FREE. Then put T on the stack at 277 and return to 271 and then to 230 of FIG. 5.

G.OUT is continually removed from the stack and the program proceeds as described above. In the logic shown in FIG. 5, the effects of G.OUT do not propagate forward. Therefore, return to 230 and remove "s" from the stack. The processing of "s" proceeds in the same way as the processing of the signals which have just been described. The result is to put all sinks of "s" on the stack, except for G.OUT (this is not put on because of the test at 273 of FIG. 8), and marking all of them FORCED ZERO. Note that none of these signals will be marked FREE, again excepting G.OUT which is already marked in this way.

The markings which result from continuing this process until the stack is empty at 230 of FIG. 5 are given in TABLE 1 below.

TABLE 1

| NODE MARKINGS AT ENTRY TO (280) | | | |
|---|---|---|---|
| | FREE | FORCED 1 | FORCED 0 |
| A.OUT | | | X |
| B.OUT | | | X |
| C.OUT | | | X |
| D.OUT | | | X |
| E.OUT | | | X |
| F.OUT | | | X |
| G.OUT | X | | X |
| H.OUT | | | X |
| I.OUT | | | X |
| J.OUT | X | X | |
| K.OUT | | X | |
| K.IN.1 | X | | X |
| K.IN.2 | X | | X |
| K.IN.3 | X | | X |
| L.OUT | | X | |
| M.OUT | | | X |
| N.OUT | | | X |
| O.OUT | | | X |
| P.OUT | | | X |
| Q.OUT | | | |
| ND.OUT | | X | |
| NE.OUT | | X | |
| NF.OUT | | X | |
| NN.OUT | | X | |
| NQ.OUT | | | |

The markings as indicated in Table 1 are provided to 280 of FIG. 5 so the FRONTIER NODES may be determined. Refer now to FIG. 9 for the details of 280. At 281 each FREE node is marked as BLOCKED and each FORCED ZERO node is marked as FRONTIER. Proceed around the loop headed at 283. Assume that at 285 NN.OUT is the first node processed. All of its sinks are FRONTIER so mark it BLOCKED and FRONTIER. If N.OUT is chosen next, again all of its sinks are BLOCKED so mark it BLOCKED and FRONTIER. Continue in this way until there is no further change in the data structures. Then go to 286 where all nodes are marked NOT FORCED ZERO and NOT FORCED ONE. Tables of the FRONTIER and BLOCKED values after the completion of 286, that is 280 of FIG. 5 are given in TABLE 2 below.

TABLE 2

| NODE MARKING AFTER (280) | | |
|---|---|---|
| | FRONTIER | BLOCKED |
| A.OUT | X | |
| B.OUT | | X |
| C.OUT | | X |
| D.OUT | | X |
| ND.OUT | | X |
| E.OUT | | X |
| NE.OUT | | X |
| F.OUT | | X |
| NF.OUT | | X |
| G.OUT | | X |
| H.OUT | X | |
| I.OUT | X | |
| J.OUT | | |
| K.OUT | | |
| K.IN.1 | | X |
| K.IN.2 | | X |
| K.IN.3 | | X |
| L.OUT | | X |
| M.OUT | X | |
| N.OUT | | X |
| NN.OUT | | X |
| O.OUT | X | |
| P.OUT | X | |
| Q.OUT | | X |
| NQ.OUT | | X |

The program now proceeds to phase 2 where the derived graph is constructed as shown in FIG. 2. Refer now to FIG. 10 at 310, the Source and Sink nodes, and nodes corresponding to the six FRONTIER nodes determined in the previous phase are added to the graph. These last six nodes are also connected to the Sink with edges which each have infinite weight. Then proceed to 320, the details of which are shown in FIG. 11, where w.e. is set to 1 for each of the six FRONTIER nodes at 321. The nodes are now traversed in reverse topological order in the loop with the test at 322. On the first iteration, say NODE=L.OUT. Then go through 323 to 324 where it is found that w.e (L)=0 and w.o (L)=1. Next, test B and C. For each of them, w.e=0.5 and w.o=0. Next, test NN where w.e (NN)=0 and w.e (NN)=2. Next, N yields w.o (N)=0 and w.e (N)=2. Continuing in this fashion, the values listed in TABLE 3 below are found.

TABLE 3

| W.E & W.O AFTER (322) FIRST PASS | | |
|---|---|---|
| | W.E | W.O |
| A.OUT | 1 | |
| B.OUT | .5 | |
| C.OUT | .5 | |
| D.OUT | 2 | |
| ND.OUT | | 2 |
| E.OUT | 2 | |
| NE.OUT | | 2 |
| F.OUT | 2 | |
| NF.OUT | | 2 |
| G.OUT | | |
| H.OUT | 1 | |
| I.OUT | 1 | |
| J.OUT | | |
| K.OUT | | |
| K.IN.1 | | |
| K.IN.2 | | |
| K.IN.3 | | |
| L.OUT | | 1 |
| M.OUT | 1 | |
| N.OUT | 2 | |

TABLE 3-continued

| W.E & W.O AFTER (322) FIRST PASS | | |
|---|---|---|
| | W.E | W.O |
| NN.OUT | | 2 |
| O.OUT | 1 | |
| P.OUT | 1 | |
| Q.OUT | 2 | |
| NQ.OUT | | 2 |

It is found that there are nodes with w.e>0, so proceed to 340 of FIG. 10. Refer now to FIG. 12 for the details of 340. Choose a node with maximal w.e, say N is chosen. In 341 mark N FORCED ZERO and connect the Source to DG (N) and finally stack N at 342. Now enter the loop at 343. Set NODE=N at 344 and go through 345 to 346. Since all inputs of NN are FORCED ZERO, stack NN and mark NN FORCED ONE. Now return to 343 and then to 344 where NODE=NN. Next, go to 345 but this time take the other branch to 347. Here the sinks of NN are marked, which are O and P, FORCED ZERO. Nodes for O and P are added to the derived graph (they are already present in this case so nothing is done) and, in the derived graph, connect N, the predecessor of NN, to O and P, the sinks of NN. Then stack O and P and return to 343.

The process continues in this manner, and eventually there is a return to 320 of FIG. 10 and this process is repeated as well.

Proceed now to FIG. 13 which constructs the complete derived graph after the node splitting and edge weighting of 410-470, and as is shown in FIG. 2. (The graph which is actually produced at the end of phase 2 is identical to that shown in FIG. 2, except that the node pairs M' and M", and N' and N" would each be a single node, and there would be no weights on the edges.)

Possible connection points of S in the optimized circuit are represented in the derived graph. NOR box G does not appear in the derived graph because G was marked as FREE during phase 2. Nodes M and N had multiple in-edges, so they have been split as described in 430 of FIG. 13. M' and M" are now associated with logic node M while N" and N" are associated with logic node N. Each derived graph edge is labelled with an edge capacity as described in 450-470. Since the Sink node and nodes M' and N' do not correspond to actual nodes in the logic graph, they do not represent legal connection points for S and the in-edges to those nodes have been given infinite capacities. All other edges have capacity one.

The max-flow/min-cut procedure is applied to the derived graph and the cut set is determined to be nodes A, M", M" and Q; these nodes are shaded in FIG. 2.

The final piece of processing as shown in FIG. 14 is to adjust the connections of the signal in question to reflect the cut-set. The current signal should be connected only at circuit nodes which correspond to nodes in the derived graph which are part of the cut-set. The result of this is to remove connects of "s" at B,C,D,E,F,G,H, and I; and to make new connects of "s" to M,N, and Q. The result of doing this is shown as the optimized circuit in FIG. 3 which is the functional equivalent of the provided logic circuit of FIG. 1, but which has fewer connections.

INDUSTRIAL APPLICABILITY

It is an object of the invention to provide a network configuration having minimal connections.

It is another object of the invention to take a provided circuit configuration and produce therefrom a final circuit configuration which is the functional equivalent of, and contains fewer connections than, the provided circuit configuration.

It is yet another object of the invention to take a provided logic circuitry implementation in a given technology which circuitry includes n signals and m nodes, and producing a final logic circuitry implementation which is the functional equivalent of, and includes fewer connections between the nodes, than does the original logic circuitry implementation.

It is still another object of the invention to take a provided NAND/NOR logic circuitry implementation is a given technology, which circuitry contains n signals and m nodes and producing therefrom a final circuitry implementation which is the functional equivalent of, and contains fewer connections than, the provided NAND/NOR logic circuitry implementation. A given one of the n signals is first processed, and global information is computed for this signal. A graphical representation of connections between the m nodes is derived from the computed global information. A list of nodes that form the graphical representation, and an optimized logic circuitry implementation is provided as a function thereof. Each of the remaining ones of the n signals are processed sequentially, as above, to form successive optimized NAND/NOR logic circuitry implementations, with the processing of the nth signal resulting in the final NAND/NOR logic circuitry implementation.

It is a further object of the invention to take an original network configuration having an original set of connections, and including at least one signal and m nodes and producing therefrom a new network configuration which is the functional equivalent of, and contains fewer connections than, the original network configuration. A determination is made as to which of the m nodes comprise FRONTIER nodes for the one signal in the original network configuration. Then, a new set of connections is determined which generate the same set of FRONTIER nodes for the one signal. Then, the original set of connections in the original network configuration are replaced with the new set of connections for producing the new network configuration.

Having thus described our invention, what we claim as new, and desire to secure by Letters Patent is:

1. A method of operating a computer to take a provided network configuration including n signals and m nodes and producing therefrom a final network configuration which is the functional equivalent of, and contains fewer connections than, said provided network configuration, said method comprising the steps of:
   computing global information relative to a given one of said n signals;
   generating a derived graphical representation of connections between said m nodes from said computed global information; deriving from said derived graphical representation of connections a list of nodes that separates a source node from a sink node, and providing a reduced number of connections between said nodes in an intermediate network configuration as determined from the derived list of nodes; and
   repeating the above steps for each of the remaining ones of said n signals, with the completion of the repetition of steps providing the reduced number of connections in said final network configuration.

2. A method of operating a computer to take an original circuit configuration of logic devices including n signals and m nodes and producing therefrom a new circuit configuration which is the functional equivalent of, and contains fewer connections than, said original circuit configuration, said method comprising the steps of:

computing global information relative to a given one of said n signals;

generating a derived graphical representation of connections between said m nodes from said computed global information;

deriving from said derived graphical representation of connections a list of nodes to which said given one of said n signals should be connected, and providing a reduced number of connections in an intermediate circuit configuration as determined from the derived list of nodes; and repeating the above steps sequentially for each of the remaining ones of said n signals, with the connections in said original circuit configuration being replaced with a reduced number of connections in said intermediate circuit configuration, with the completion of the nth sequential repetition of steps resulting in a new reduced set of connections in said new circuit configuration.

3. A method of operating a computer to take a provided logic circuitry implementation in a given technology, which circuitry includes n signals and m nodes and producing therefrom a final logic circuitry implementation which is the functional equivalent of, and contains fewer connections than, said provided logic circuitry implementation, said method comprising the steps of:

(a) taking a given one of said n signals and computing global information relative thereto;

(b) generating a derived graphical representation of connections between said m nodes from said computed global information;

(c) deriving from said derived graphical representation of connections a list of nodes that separates a source node from a sink node, and providing a reduced number of connections in an intermediate logic circuitry implementation as determined from the derived list of nodes; and (d) repeating steps (a) thru (c) sequentially for each of the remaining ones of said n signals, with the completion of the nth sequential repetition of steps providing the reduced number of connections in said final logic circuitry implementation.

4. A method of operating a computer to take a provided logic circuitry implementation in a given technology, which circuitry includes n signals and m nodes, and producing therefrom a final logic circuitry implementation which is the functional equivalent of, and contains fewer connections than, said provided logic circuitry implementation, said method comprising the steps of:

(a) taking a given one of said n signals and computing global information relative thereto;

(b) generating a derived graphical representation of connections between said m nodes from said computed global information;

(c) deriving from said derived graphical representation of connections a list of nodes that separates a source node from a sink node;

(d) providing a reduced number of connections in an intermediate circuitry implementation as a function of the derived list of nodes; and (e) repeating steps (a) thru (d) sequentially for each of the remaining ones of said n signals, with the completion of the nth sequential repetition of steps (a) thru (d) resulting in the reduced number of connections in said final logic circuitry implementation.

5. The method of claim 4, wherein step (d) includes the steps of:

(1) getting a node from the derived list of nodes of said derived graphical representation, and getting the corresponding node in said provided logic circuitry;

(2) determining if said given one of said n signals is connected to the node gotten in step (1), if not connect it, and if so connected go to step (3);

(3) determining if there are more nodes in the derived list of nodes, if there are more nodes in the derived list of nodes repeat steps (1) and (2), if there are no more nodes in the derived list of nodes go to step (4);

(4) getting a sink node of said given one of said n signals in said provided logic and getting the corresponding node in said derived graph;

(5) determining if said sink node is in said derived list of nodes, if said sink node is not in said derived list disconnect it, if said sink node is in said derived list go to step (6);

(6) determining if there are more sink nodes in said provided logic circuitry, if there are more sink nodes, repeat steps (4) and (5), if there are not more sink nodes, said intermediate logic circuitry implementation is complete.

6. The method of claim 4, wherein step (b) includes the steps of:

(1) selecting a node in said derived graph;

(2) determining if the selected node has more than one input edge, if if does not go to step (4), if it does go to step (3);

(3) splitting the selected node into two new nodes, and copying the input edges from the selected to the first new node, and building an edge between the first new node and the second new node, and copying the out-edge of the selected node to the second new node, and associate the selected node with the second new node;

(4) determing if there are more nodes in the derived graph, if there are more nodes go to step (1), if there are not more nodes go to step (5);

(5) select an edge from the derived graph;

(6) determining if the to-node of the edge is a legal connection point, if so assign a capacity to the edge which describes the desirability of having a connection of the given signal at this point, if not assigning an infinite capacity to the edge;

(7) determining if there are more edges in the derived graph, if there are more edges return to step (5), if there are not more edges go to step (7);

(8) applying a max-flow/min-cut analysis to the derived graph, and deriving therefrom a list of nodes to which said given one of said n signals should be connected.

7. A method of operating a computer to tab an original network configuration having an original set of connections, and including at least one signal and m nodes and producing therefrom a new network configuration which is the functional equivalent of, and contains fewer connections than, said original network configuration, said method comprising the steps of:

determining which of said m nodes comprise FRONTIER nodes for said one signal in said original network configuration;

determining a new set of a reduced number of connections which generates the same set of FRONTIER nodes for said one signal; and replacing the original set of connections in said original network configuration with said new set of a reduced number of connections for producing said new network configuration having a reduced number of connections.

8. A method of operating a computer to take an original logic circuit implementation in a given technology having an original set of connections, and including n signals and m nodes and producing therefrom a new logic circuit implementation which is the functional equivalent of, and contains fewer connections than, said original logic circuit implementation, said method comprising the steps of:

(a) determining which of said m nodes comprise FRONTIER nodes for a given one of said n signals in said original logic circuit implementation;

(b) determining a different set of a reduced number of connections which generates the same set of frontier nodes for said given one of said n signals;

(c) replacing the original set of connections in said original circuit with said different set of a reduced number of connections for producing an intermediate logic circuit implementation; and repeating steps (a) through (c) for each of the remaining ones of said n signals, which said intermediate logic circuit implementation being replaced by the reduced number of connections in said new logic circuit implementation.

* * * * *